US 7,756,488 B2

(12) United States Patent
Watanabe et al.

(10) Patent No.: US 7,756,488 B2
(45) Date of Patent: Jul. 13, 2010

(54) HIGH-FREQUENCY SWITCH MODULE

(75) Inventors: Shinya Watanabe, Yasu (JP); Koji Furutani, Moriyama (JP)

(73) Assignee: Murata Manufacturing Co., Ltd, Kyoto (JP)

(*) Notice: Subject to any disclaimer, the term of this patent is extended or adjusted under 35 U.S.C. 154(b) by 720 days.

(21) Appl. No.: 11/668,570

(22) Filed: Jan. 30, 2007

(65) Prior Publication Data
US 2007/0123175 A1 May 31, 2007

Related U.S. Application Data

(63) Continuation of application No. PCT/JP2005/020814, filed on Nov. 14, 2005.

(30) Foreign Application Priority Data
Nov. 25, 2004 (JP) .............................. 2004-340585

(51) Int. Cl.
H04B 1/44 (2006.01)
(52) U.S. Cl. ............................ 455/78; 455/83; 455/296
(58) Field of Classification Search .................. 455/78, 455/82, 83, 296
See application file for complete search history.

(56) References Cited

U.S. PATENT DOCUMENTS

| 6,396,348 | B1* | 5/2002 | Honjo ......................... 330/286 |
| 6,704,550 | B1* | 3/2004 | Kohama et al. .......... 455/114.2 |
| 6,987,984 | B1 | 1/2006 | Kemmochi et al. |
| 7,130,655 | B2 | 10/2006 | Kemmochi et al. |
| 7,142,884 | B2 | 11/2006 | Hagn |
| 7,171,234 | B2 | 1/2007 | Kemmochi et al. |
| 2002/0196078 | A1* | 12/2002 | Honda et al. .............. 330/207 A |
| 2004/0127182 | A1* | 7/2004 | Hayashi .................. 455/193.1 |
| 2004/0266378 | A1 | 12/2004 | Fukamachi et al. |
| 2005/0245202 | A1* | 11/2005 | Ranta et al. ................... 455/78 |

FOREIGN PATENT DOCUMENTS

| EP | 1085667 A1 | 3/2001 |
| EP | 1 143 629 A1 | 10/2001 |

(Continued)

OTHER PUBLICATIONS

Official Communication for PCT Application No. PCT/JP2005/020814; mailed on Feb. 28, 2006.

(Continued)

*Primary Examiner*—Lana N Le
*Assistant Examiner*—Hsin-Chun Liao
(74) *Attorney, Agent, or Firm*—Keating & Bennett, LLP

(57) ABSTRACT

A FET switch enables an antenna input/output port connected to an antenna to connect to any of a port connected to a transmission signal input terminal and ports respectively connected to two reception signal output terminals by switching between the ports. After a transmission signal is input through the transmission signal input terminal and is then input from the port to the FET switch, harmonic distortion occurs and is output to the transmission signal input terminal side. A phase setting element connected to the port changes an impedance of the input side viewed from the port with respect to harmonics from an open state to a short-circuited state, so as to disperse the harmonics. Accordingly, harmonics returning to the port are greatly suppressed and minimized.

6 Claims, 7 Drawing Sheets

FOREIGN PATENT DOCUMENTS

| | | | |
|---|---|---|---|
| EP | 1401045 | A1 | 3/2004 |
| EP | 1418680 | A1 | 5/2004 |
| JP | 2001-086026 | A | 3/2001 |
| JP | 2002-64301 | A | 2/2002 |
| JP | 2002-185356 | A | 6/2002 |
| JP | 2004-112160 | A | 4/2004 |
| JP | 2004-135316 | A | 4/2004 |
| JP | 2004-140696 | A | 5/2004 |
| JP | 2004-253953 | A | 9/2004 |

OTHER PUBLICATIONS

Official communication issued in the counterpart European Application No. 05806313.2, mailed on Jan. 30, 2007.

Official communication issued in the counterpart Japanese Application No. 2006-547726, mailed on Aug. 7, 2007.

Official communication issued in counterpart European Application No. 05 806 313.2, mailed on Nov. 5, 2007.

Official communication issued in counterpart European Application No. 08018478.1, mailed on Dec. 18, 2008.

* cited by examiner

HIGH-FREQUENCY SWITCH MODULE

BACKGROUND OF INVENTION

1. Field of the Invention

The present invention relates to a high-frequency switch module to switch between transmission and reception of a communication signal having a specific frequency, and more particularly, the present invention relates to a high-frequency switch module using a FET (field-effect transistor) switch.

2. Description of the Related Art

At present, a radio communication method for mobile phones or other devices has a plurality of specifications. For example, a multi-band GSM (global system for mobile communications) method has been adopted in Europe. In the GSM method, a plurality of communication signals (transmission/reception signals) having different frequency bands, e.g., an 850 MHz band and a 900 MHz band, are used. A 1800 MHz band and a 1900 MHz band are also used. When such a plurality of communication signals having different frequency bands are transmitted/received by one antenna, communication signals other than a communication signal of a desired frequency band are not required. Furthermore, a reception signal is not required during transmission, whereas a transmission signal is not required during reception. Therefore, in order to perform transmission and reception with one antenna, the antenna must switch between a path to transmit a transmission signal of a desired communication signal and a path to transmit a reception signal of a desired communication signal. Various types of high-frequency switch modules including a FET switch have been used (e.g., see Japanese Unexamined Patent Application Publication No. 2002-185356 (Patent Document 1)).

Patent Document 1 discloses a high-frequency switch module shown in FIG. 7.

FIG. 7 is a block diagram showing a configuration of the known high-frequency switch module.

The known high-frequency switch module includes a FET switch SW100, which includes a transmission port RF101 to receive a transmission signal of a first communication signal (first transmission signal) and a transmission signal of a second communication signal (second transmission signal), a first reception port RF102 to output a reception signal of the first communication signal (first reception signal), a second reception port RF103 to output a reception signal of the second communication signal (second reception signal), and an antenna port ANT0 to output the first and second transmission signals to an antenna and to receive the first and second reception signals from the antenna. A switch made of a semiconductor, particularly a FET, is used as the FET switch SW100. A GeAs switch is used in many cases. In this known high-frequency switch module, a low-pass filter LPF201 to attenuate harmonics of the first and second transmission signals is connected to the transmission port RF101, a band-pass filter BPF301 to allow a fundamental of the first reception signal to pass therethrough is connected to the first reception port RF102, and a band-pass filter BPF302 to allow a fundamental of the second reception signal to pass therethrough is connected to the second reception port RF202.

In the above-described high-frequency switch module, a transmission signal is input to a transmission signal input terminal TX1 connected to the transmission port RF101 of the FET switch SW100 through the low-pass filter LPF201. The transmission signal is input after being amplified by a power amplifier PA that is typically connected in a previous stage. At the amplification, higher-order harmonics to a fundamental frequency fo of the transmission signal are generated and are input together with the transmission signal of the fundamental frequency fo. Herein, if the low-pass filter LPF201 of the high-frequency switch module shown in FIG. 7 is set so as to attenuate the higher-order harmonics, the higher-order harmonics of the transmission signal input to the FET switch SW100 can be suppressed. For example, if the low-pass filter LPF201 includes a low-pass filter to attenuate a second-order harmonic of the fundamental frequency fo (2·fo) and a low-pass filter to attenuate a third-order harmonic of the fundamental frequency fo (3·fo), the second-order and third-order harmonics are suppressed.

However, if the FET switch SW100 is a GaAs switch and if a high-frequency transmission signal is input thereto, harmonic distortion occurs in the FET switch SW100, and thus, harmonics including a double harmonic and a triple harmonic are evenly output to the respective ports. At this time, when the low-pass filter LPF201 is viewed from the transmission port RF101 in the frequency of the above-described harmonics, the impedance value approaches infinity, this means open state, and the harmonics generated in the FET switch SW100 are completely reflected at the transmission port RF101 side end of the low-pass filter LPF201 and are input to the FET switch SW100. As a result, assuming that the original harmonics are "X" and that the additional harmonics caused by the complete reflection are "α", harmonics "X+α" are output from the antenna port ANT0.

Such harmonics may be suppressed by using a GaAs switch that suppresses generation of harmonics. However, such a switch does not actually exist. Also, generation of harmonics may be suppressed by using a switch circuit including a diode switch. However, at least two diodes are required for switching between transmission and reception of each communication signal and a circuit added to those diodes is also necessary, such that the high-frequency switch module cannot be miniaturized. Furthermore, use of a plurality of diode switches causes an increase in power consumption and a decrease in response speed. Particularly, these disadvantages become significant as the number of ports of the FET switch increases.

SUMMARY OF THE INVENTION

To overcome the problems described above, preferred embodiments of the present invention provide a miniaturized high-frequency switch module including a FET switch, such as a GaAs switch, which suppresses harmonic distortion.

A referred embodiment of the present invention provides a high-frequency switch module including a FET switch that includes a transmission input port to receive a transmission signal, a reception output port to output a reception signal, and an antenna port to output the transmission signal to an antenna or to receive the reception signal from the antenna, and that connects the antenna port to the transmission input port or the reception output port by switching between the input and output ports, and a filter that connects to the transmission input port and that attenuates a higher-order harmonic of the transmission signal. The high-frequency switch module includes a phase setting element which shifts an impedance of the filter side viewed from the transmission input port with respect to the higher-order harmonic toward zero, the phase setting element being provided between the transmission input port of the FET switch and the filter. The phase setting element enables a Smith chart position of an impedance of the filter side viewed from the transmission input port with respect to a second-order or third-order harmonic of the transmission signal to be positioned near the zero impedance.

With this configuration, the phase setting element enables the impedance of the filter side viewed from the transmission input port with respect to higher-order harmonics including second-order and third-order harmonics to be shifted towards zero, not towards infinity. Therefore, harmonics from the transmission input port of the FET switch easily flow to the ground of the filter, and thus, the harmonics disperse and complete reflection is prevented. Accordingly, the amount of harmonics returning to the FET switch is reduced, such that the harmonics output from the antenna port of the FET switch are reduced as compared to the known art.

In the high-frequency switch module according to another preferred embodiment of the present invention, the phase setting element includes a transmission line having an electrical length such that an absolute value of an impedance with respect to a fundamental of the transmission signal does not substantially change.

With this configuration, the absolute value of the impedance with respect to the fundamental of the transmission signal does not change due to the phase setting element (transmission line), such that transmission loss of the transmission signal (fundamental) does not occur in this transmission line.

In the high-frequency switch module according to preferred embodiments of the present invention, the electrical length is preferably less than about one fourth of the wavelength of the second-order harmonic.

With this configuration, by setting the electrical length to less than about one fourth of the wavelength of the second-order harmonic, harmonics are suppressed and loss in the entire module is suppressed.

In the high-frequency switch module according to another preferred embodiment of the present invention, the phase setting element enables Smith chart positions of impedances of the filter side viewed from the transmission input port with respect to the second-order and third-order harmonics of the transmission signal to sandwich the zero impedance.

With this configuration, as an example of a specific setting method, Smith chart positions of impedances of the filter side viewed from the transmission input port with respect to the second-order and third-order harmonics of the transmission signal sandwich the zero impedance.

In the high-frequency switch module, a low-pass filter whose stop band includes a frequency of the second-order or third-order harmonic is preferably provided as the filter.

With this configuration, even if harmonics are transmitted from a power amplifier in a previous stage, the harmonics are suppressed by the low-pass filter.

In the high-frequency switch module according to another preferred embodiment, the low-pass filter preferably includes a first low-pass filter and a second low-pass filter, the stop band of the first low-pass filter including a frequency of the second-order harmonic of the transmission signal and the stop band of the second low-pass filter including a frequency of the third-order harmonic of the transmission signal.

With this configuration, even if harmonics are transmitted from the power amplifier in the previous stage, the second-order harmonic is suppressed by the first low-pass filter and the third-order harmonic is suppressed by the second low-pass filter.

In the high-frequency switch module according to another preferred embodiment, a plurality of communication signals including transmission and reception signals using specific frequency bands are input/output and switched, and the FET switch includes reception output ports for at least the respective communication signals.

With this configuration, even if a plurality of communication signals are input/output to/from the high-frequency switch module, harmonics are suppressed because the phase setting element is provided for the transmission input port.

In the high-frequency switch module according to another preferred embodiment, the transmission input port includes a plurality of transmission input ports and the phase setting element includes a plurality of phase setting elements connected to the respective transmission input ports.

With this configuration, since the respective phase setting elements are provided in accordance with harmonics of transmission signals input to the respective transmission input ports, harmonic distortion is suppressed when a transmission signal is input to any of the transmission input ports.

The high-frequency switch module according to another preferred embodiment includes a FET switch including a first transmission input port to receive a transmission signal of a first communication signal using a first frequency band and a transmission signal of a second communication signal using a second frequency band, a second transmission input port to receive a transmission signal of a third communication signal using a third frequency band and a transmission signal of a fourth communication signal using a fourth frequency band, a first reception output port to output a reception signal of the first communication signal, a second reception output port to output a reception signal of the second communication signal, a third reception output port to output a reception signal of the third communication signal, and a fourth reception output port to output a reception signal of the fourth communication signal, a first phase setting element that connects to the first transmission input port and that has a phase condition where impedances with respect to higher-order harmonics of the transmission signal of the first communication signal and the transmission signal of the second communication signal viewed from the first transmission input port shift from the infinite towards zero, and a second phase setting element that connects to the second transmission input port and that has a phase condition wherein impedances with respect to higher-order harmonics of the transmission signal of the third communication signal and the transmission signal of the fourth communication signal viewed from the second transmission input port are shifted from infinity towards zero.

With this configuration, even if any of the first and second transmission signals are input to the first transmission input port, harmonics of the transmission signal partially pass and disperse in the filter direction due to the first phase setting element. Accordingly, harmonics returning to the first transmission input port of the FET switch are suppressed, such that harmonics output from the antenna port of the FET switch are reduced as compared to the known art. In addition, even if any of the third and fourth transmission signals are input to the second transmission input port, harmonics of the transmission signal partially pass and disperse in the filter direction due to the second phase setting element. Accordingly, harmonics returning to the second transmission input port of the FET switch are suppressed, such that harmonics output from the antenna port of the FET switch are reduced as compared to the known art. In this manner, harmonics generated by the FET switch are suppressed with respect to any of the transmission signals using four different frequency bands.

In the high-frequency switch module according to preferred embodiments of the present invention, the FET switch, the filter, and the phase setting element are preferably integrally configured into a laminated body including a plurality of laminated dielectric layers.

In the high-frequency switch module according to preferred embodiments of the present invention, the filter and the phase setting element are preferably disposed in the laminated body.

With this configuration, the high-frequency switch module is integrally provided in the laminated body, and thus, is miniaturized. Furthermore, the filter and the phase setting element are disposed in the laminated body, which further improves the miniaturization.

According to preferred embodiments of the present invention, by providing the phase setting element, harmonics output from the transmission input port due to harmonic distortion occurring in the FET switch are easily transmitted to the ground of the filter on the transmission input side. Accordingly, the harmonics disperse and complete reflection is prevented, and thus, the amount of harmonics returning to the FET switch is suppressed and minimized. As a result, harmonics output from the antenna port of the FET switch are significantly reduced as compared to the known art. That is, a high-frequency switch module having greatly reduced harmonics is provided.

According to this configuration, a high-frequency switch module which reduces only higher-order harmonics without causing transmission loss of a fundamental of a transmission signal is obtained with a simple structure.

By setting the electrical length to less than about one fourth of the wavelength of a second-order harmonic, a high-frequency switch module which suppresses harmonics and entire loss is obtained.

By placing Smith chart positions of impedances of the filter side viewed from the transmission input port with respect to second-order and third-order harmonics of a transmission signal so as to sandwich the zero impedance, harmonics are suppressed.

Even if harmonics are transmitted together with a transmission signal of a fundamental from a power amplifier in a previous stage, the harmonics are suppressed by the low-pass filter, such that the harmonics to be input to the transmission input port are suppressed. Accordingly, a high-frequency switch module which further suppresses harmonics is obtained.

Even if harmonics are transmitted together with a transmission signal of a fundamental from a power amplifier in a previous stage, a second-order harmonic is suppressed by the first low-pass filter and a third-order harmonic is suppressed by the second low-pass filter, such that the harmonics to be input to the transmission input port are suppressed. Accordingly, a high-frequency switch module which further suppresses harmonics is obtained.

Even if a plurality of communication signals are input/output to/from the high-frequency switch module, the high-frequency switch module suppresses harmonic distortion with respect to any communication signal regardless of the type of the communication signal, because the phase setting elements are provided for the respective transmission input ports.

A high-frequency switch module which suppresses harmonics with respect to any of communication signals using four different frequency bands is thus obtained.

The respective elements defined by the high-frequency switch module are integrated in the laminated body, such that the high-frequency switch module which suppresses harmonics is miniaturized.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A high-frequency switch module according to a first preferred embodiment of the present invention is described with reference to FIGS. 1, 2, and 3.

Figure 1:
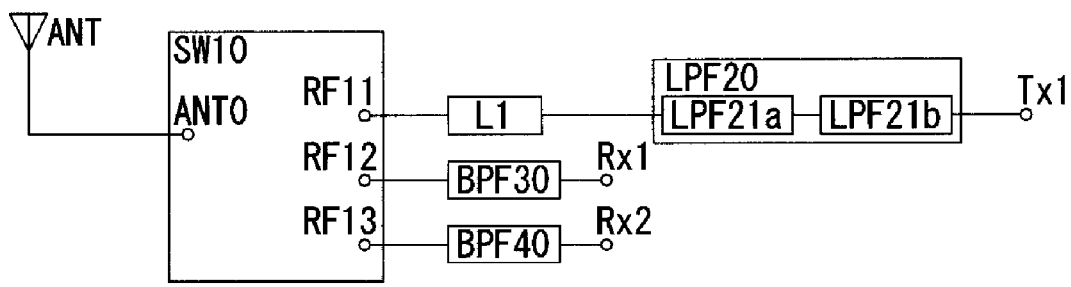
FIG. 1 is a block diagram showing a configuration of a high-frequency switch module according to a first preferred embodiment of the present invention.

FIG. 1 is a block diagram showing a configuration of the high-frequency switch module according to this preferred embodiment.

In the high-frequency switch module according to this preferred embodiment, a GSM 850 MHz transmission signal or a GSM 900 MHz transmission signal is input to a transmission signal input terminal Tx1, a GSM 850 MHz reception signal is output from a reception signal output terminal Rx1, and a GSM 900 MHz reception signal is output from a reception signal output terminal Rx2. A FET switch SW10 including a GaAs switch includes an antenna input/output port ANT0 connecting to an antenna ANT and RF input/output ports RF11, RF12, and RF13 (hereinafter simply referred to as "RF11 port", "RF12 port", and "RF13 port") to input/output any of GSM 850 MHz transmission/reception signals and GSM 900 MHz transmission/reception signals. The FET switch SW10 also includes a driving voltage input terminal (not shown) to which a driving voltage is input and a control signal input terminal (not shown) to which a control signal to control switching is input. The control signal input to the control signal input terminal causes conduction between the antenna input/output port ANT0 and any of the RF11 to RF13 ports. In this preferred embodiment, the RF11 port connects to the transmission signal input terminal Tx1, and the RF12 port and the RF13 port connect to the reception signal output terminals Rx1 and Rx2, respectively. The RF11 port corresponds to a "transmission signal input port," and each of the RF12 port and the RF13 port corresponds to a "reception signal output port."

The RF11 port of the FET switch SW10 connects to a phase setting element L1 serving as a transmission line. An end of the phase setting element L1, which is opposite to the RF11 port, connects to a low-pass filter LPF20. The electrical length of the phase setting element L1 is set to substantially one fourth of the wavelength of a transmission signal to be transmitted, that is, a GSM 850 MHz transmission signal and a GSM 900 MHz transmission signal. In other words, assuming that the electrical length of the phase setting element L1 is "A" and that the wavelength of the transmission signal is "λ", 0<A<λ/4 is satisfied. Herein, the wavelength λ of the GSM 850 MHz transmission signal is slightly different from that of the GSM 900 MHz transmission signal. However, both wavelengths have little difference from each other. For example, the wavelength of the GSM 850 MHz transmission signal having a longer wavelength is set as the "λ". The phase setting element L1 is defined by a transmission line.

The low-pass filter LPF20 includes two low-pass filters LPF21a and LPF21b having different frequency characteristics (attenuation characteristics). These two low-pass filters are arranged in the order of the low-pass filter LPF21a and the low-pass filter LPF21b from the side of the phase setting element L1. The low-pass filter LPF21a has a frequency characteristic such that a fundamental frequency of the GSM 850 MHz transmission signal is in the pass band and a frequency twice the fundamental frequency is in the stop band, and such that a fundamental frequency of the GSM 900 MHz transmission signal is in the pass band and a frequency twice the fundamental frequency is in the stop band. The low-pass filter LPF21b has a frequency characteristic such that at least a fundamental frequency of the GSM 850 MHz transmission signal is in the pass band and a frequency three times the fundamental frequency is in the stop band, and such that at least a fundamental frequency of the GSM 900 MHz transmission signal is in the pass band and a frequency three times the fundamental frequency is in the stop band.

An end of the low-pass filter LPF20, which is opposite to the phase setting element L1, connects to the transmission signal input terminal Tx1 connecting to a power amplifier PA (not shown) in a previous stage.

The RF12 port of the FET switch SW10 is connected to a band-pass filter BPF30 whose pass band includes a frequency of the GSM 850 MHz reception signal. The band-pass filter BPF30 is connected to the reception signal output terminal Rx1. The RF13 port of the switch circuit SW10 is connected to a band-pass filter BPF40 whose pass band includes a frequency of the GSM 900 MHz reception signal. The band-pass filter BPF40 is connected to the reception signal output terminal Rx2.

Hereinafter, an operation of transmitting the GSM 850 MHz transmission signal and the GSM 900 MHz transmission signal (hereinafter collectively referred to as "GSM transmission signals") performed by the high-frequency switch module according to this preferred embodiment is described. These two transmission signals are not simultaneously input, but only one of the transmission signals is input.

After a control signal to cause conduction between the RF11 port and the antenna input/output port ANT0 is input to the control signal input terminal of the FET switch SW10, the FET switch SW10 allows the RF11 port and the antenna input/output port ANT0 to come into conduction. In this state, if a GSM transmission signal is input to the transmission signal input terminal Tx1, second-order and third-order harmonics input together with a fundamental of the GSM transmission signal are attenuated in the low-pass filter LPF20, and then the GSM transmission signal is input to the RF11 port through the phase setting element L1.

After the GSM transmission signal is input to the FET switch SW10, harmonic distortion occurs due to a nonlinear characteristic of the GaAs switch, such that harmonics of a predetermined amount "X" are evenly output to the respective ports (RF11 port, RF12 port, RF13 port, and antenna input/output port ANT0).

The harmonics output from the RF11 port are transmitted to the phase setting element L1. Herein, the phase setting element L1 preferably has a predetermined electrical length on the basis of the following condition. That is, the electrical length is set to a length such that the harmonics of the GSM transmission signal output from the RF11 port are transmitted through the phase setting element L1 so that the phase thereof shifts and the impedance of the low-pass filter LPF20 side viewed from the RF11 port with respect to the harmonics shifts by a predetermined amount from infinity towards 0 (zero). Accordingly, the low-pass filter LPF20 side changes from an open state toward a short-circuited state, when viewed from the RF11 port.

In this preferred embodiment, when the low-pass filter LPF21a for a second-order harmonic is connected in series to the low-pass filter LPF21b for a third-order harmonic, for the second-order harmonic, a predetermined electrical length is set only by the phase setting element L1, whereas for the third-order harmonic, a predetermined electrical length is set by a transmission line including the phase setting element L1 and the low-pass filter LPF21a. That is, an optimum electrical length "A" is set by considering an impedance to a second-order harmonic and an impedance to a third-order harmonic.

Under this condition, the optimum electrical length is about one fourth of the wavelength of a harmonic or less (0<A<λ/4), considering other loss factors.

Figure 2A:
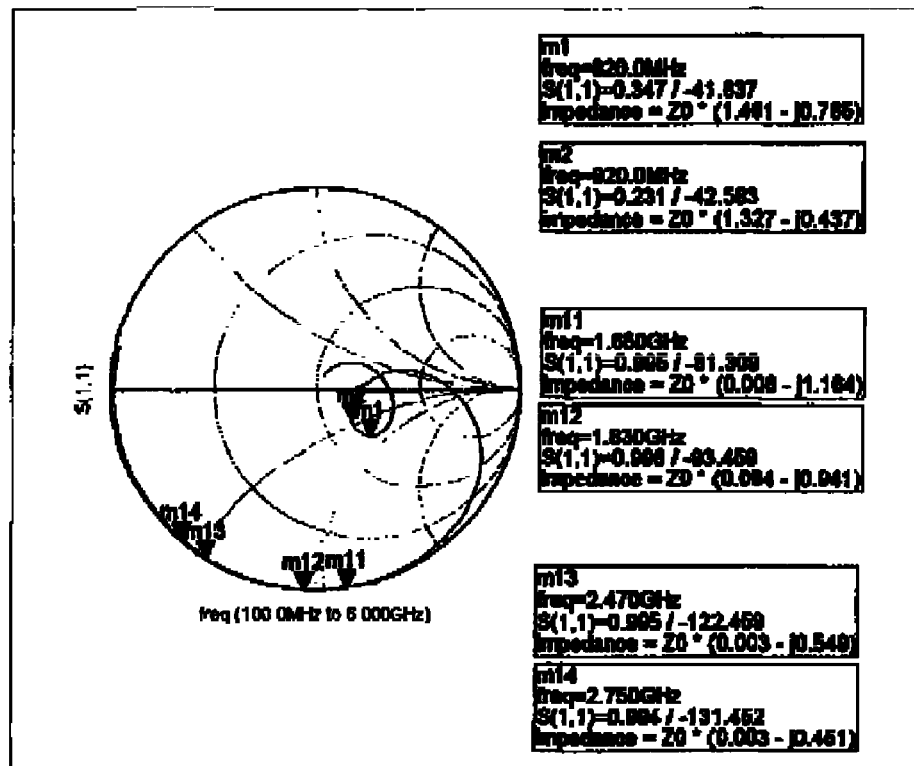
FIGS. 2A and 2B include Smith charts showing a frequency characteristic of impedances of a transmission signal input terminal Tx1 side viewed from a FET switch.
Figure 2B:
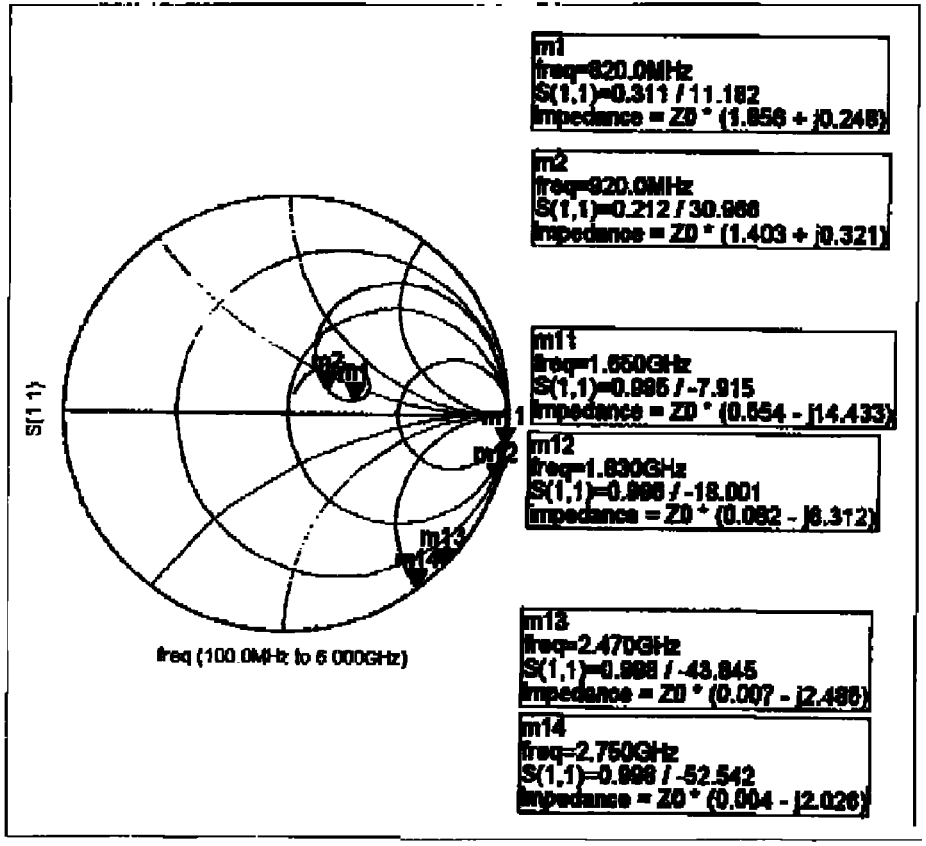
Figure 3A:
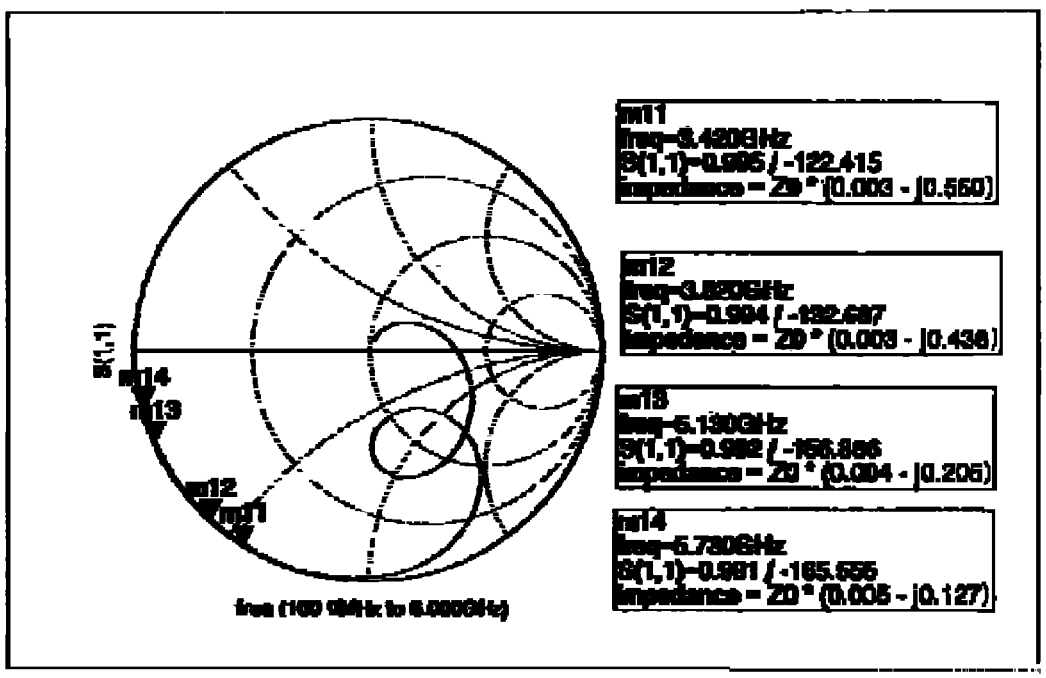
FIGS. 3A and 3B include Smith charts showing a frequency characteristic of impedances of the transmission signal input terminal Tx1 side viewed from the FET switch.
Figure 3B:
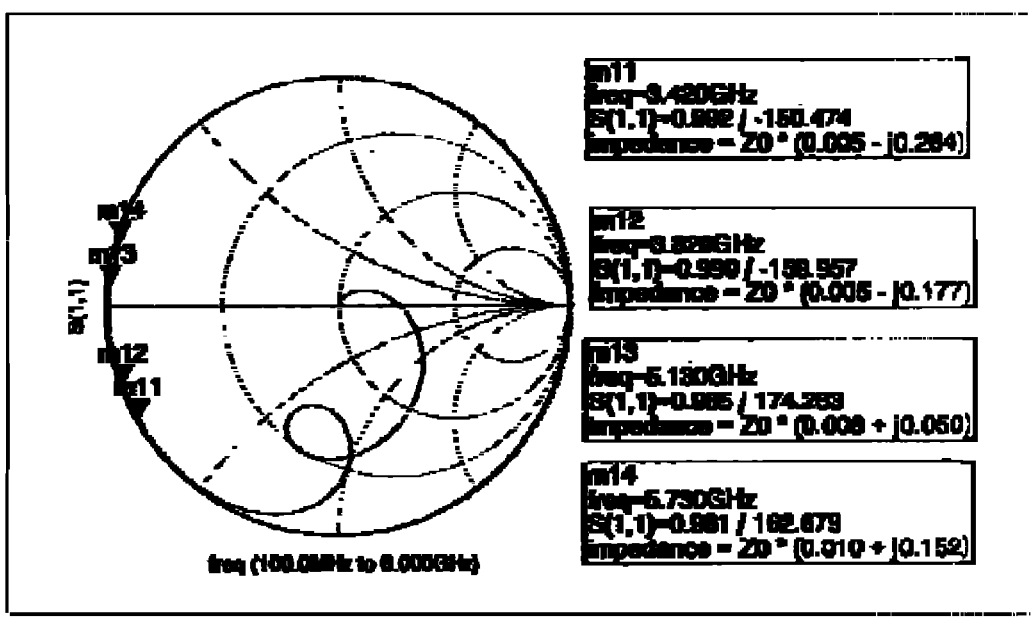

The state described above is illustrated in the Smith charts shown in FIGS. 2A and 2B. FIGS. 2A and 2B include impedance charts of the transmission signal input terminal Tx1 side viewed from the FET switch, wherein FIG. 2A shows the configuration according to this preferred embodiment, that is, where the phase setting element L1 is provided; and FIG. 2B shows a known configuration, that is, where the phase setting element L1 is not provided. In FIGS. 2A and 2B, a solid line (bold line) indicates a locus of impedance. In FIGS. 2A and 2B, m1 indicates a 820 MHz point, which is a frequency of the GSM 850 MHz transmission signal; m2 indicates a 920 MHz point, which is a frequency of the GSM 900 MHz transmission signal; m11 indicates a 1650 MHz point, which is a frequency of a double harmonic of the GSM 850 MHz transmission signal; m12 indicates a 1830 MHz point, which is a frequency of a double harmonic of the GSM 900 MHz transmission signal; m13 indicates a 2470 MHz point, which is a frequency of a triple harmonic of the GSM 850 MHz transmission signal; and m14 indicates a 2750 MHz point, which is a frequency of a triple harmonic of the GSM 900 MHz transmission signal. The data shown in FIGS. 2A and 2B is obtained when the electrical length "A" of the phase setting element L1 is set to about one fourth of the wavelength of the GSM 850 MHz transmission signal. Also, FIGS. 3A and 3B include impedance charts of the transmission signal input terminal Tx1 side viewed from the FET switch, wherein FIG. 3A shows a case in which Smith chart positions of impedances to a second-order harmonic 2fo and a third-order harmonic 3fo are positioned near the zero impedance; and FIG. 3B shows a case in which Smith chart positions of impedances to a second-order harmonic 2fo and a third-order harmonic 3fo are positioned to sandwich the zero impedance. In FIGS. 3A and 3B, m11 to m14 are defined in the same manner as in FIGS. 2A and 2B.

As shown in FIG. 2B, when the phase setting element L1 is not provided between the RF11 port and the low-pass filter LPF20, the impedance in the frequency of a double harmonic of the GSM 850 MHz transmission signal and the frequency of a double harmonic of the GSM 900 MHz transmission signal is infinity. This means that the low-pass filter LPF20 side is in an open state when viewed from the RF11 port and that a double harmonic of the GSM 850 MHz transmission signal and the GSM 900 MHz transmission signal is completely reflected. Also, the impedance is high in the frequency of a triple harmonic of the GSM 850 MHz transmission signal and that of the GSM 900 MHz transmission signal, such that the triple harmonic reflected to the RF11 port is also large.

On the other hand, when the phase setting element L1 is provided, the impedances in the frequencies of double and triple harmonics of the GSM 850 MHz transmission signal and those of the GSM 900 MHz transmission signal shift clockwise from infinity towards zero by about ¼ round on the Smith chart, as shown in FIG. 2A. Due to the change in impedance, the state on the low-pass pass filter LPF20 side viewed from the RF11 port is not open. Therefore, a portion of the double and triple harmonics of the respective transmission signals leaks to the low-pass filter LPF20 side and disperses.

According to the configuration of this preferred embodiment, in which the phase setting element L1 is provided between the RF11 port and the low-pass filter LPF20 on the transmission side, not all harmonics output from the RF11 port return to the RF11 port by complete reflection, but a portion of the harmonics is transmitted to the low-pass filter LPF20 side. The harmonics (including second-order and third-order harmonics) transmitted to the low-pass filter LPF20 are transmitted to the ground and do not return to the RF11 port.

Accordingly, assuming that the amount of harmonics that reflect and return to the RF11 port (reflected harmonics) is "β", the amount "β" is reliably smaller than "α", which is the amount of reflected harmonics in the known high-frequency switch module (β<α).

As shown in FIG. 3A, when the electrical length of the phase setting element L1 defined by a transmission line is longer than that in FIG. 2A and when the impedances are closer to zero on the Smith chart, the amount of reflected harmonics "β" is consistently less than the amount of reflected harmonics "α" in the known high-frequency switch module (β<α). Likewise, as shown in FIG. 3B, when the electrical length of the phase setting element L1 defined by a transmission line is greater than that in FIG. 3A, when the impedance to the second-order harmonic is approximately zero, and when the Smith chart positions of the impedances to the second-order and third-order harmonics are positioned to sandwich the zero impedance, the amount of reflected harmonics "β" is further less than the amount of reflected harmonics "α" in the known high-frequency switch module (β<αa).

As shown in FIGS. 2A and 2B, even when the phase setting element L1 is provided between the RF11 port and the low-pass filter LPF20, the impedance to the frequencies of the fundamentals of the GSM 850 MHz transmission signal and the GSM 900 MHz transmission signal is approximately the same as the impedance obtained when the phase setting element L1 is not provided. Therefore, the phase setting element L1 does not have a negative effect on transmission of the fundamentals.

On the other hand, harmonics output from the RF12 port and the RF13 port are transmitted to the band-pass filters BPF30 and BPF40 and are attenuated, and thus, do not return to the RF12 port and the RF13 port.

Figure 7:
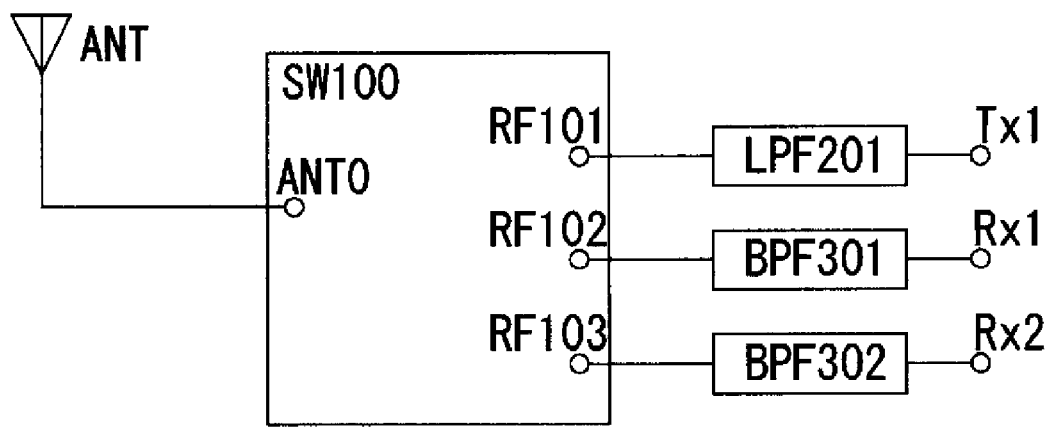
FIG. 7 is a block diagram showing a configuration of a known high-frequency switch module.

Therefore, the amount of reflected harmonics returning to the FET switch SW10 is less than that in the known high-frequency switch module (FIG. 7), which is not provided with the phase setting element L1. As a result, the amount of harmonics output to the antenna input/output port ANT0 is "X+β", which is less than the amount of harmonics "X+αa" in the known high-frequency switch module (FIG. 7).

As described above, by using the configuration according to this preferred embodiment, harmonics output to the antenna are significantly reduced and a transmission characteristic is improved. The phase setting element L1 is set such that the impedance changes with respect to only the harmonics. Thus, with respect to a fundamental of a GSM transmission signal, the phase is changed, but the impedance is not substantially changed. As a result, the fundamental of the GSM transmission signal is transmitted while not being substantially attenuated. That is, a high-frequency switch module capable of suppressing only harmonics of GSM transmission signals and transmitting the signals without substantial loss in the fundamentals is provided.

Hereinafter, a high-frequency switch module according to a second preferred embodiment is described with reference to FIGS. 4 to 6.

Figure 4:
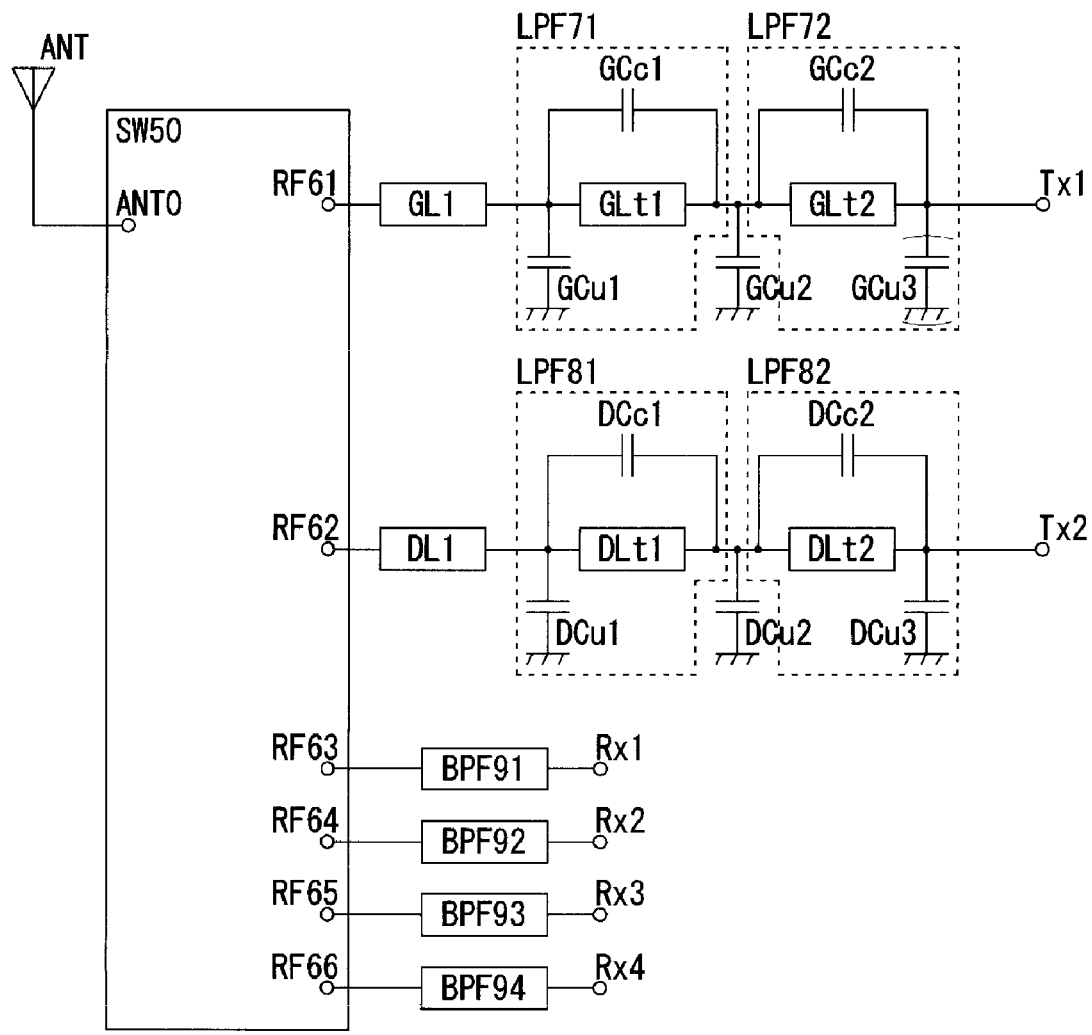
FIG. 4 is a block diagram showing a configuration of a high-frequency switch module according to a second preferred embodiment of the present invention.

FIG. 4 is a block diagram showing a configuration of the high-frequency switch module according to this preferred embodiment.

In the high-frequency switch module according to this preferred embodiment, a GSM 850 MHz transmission signal or a GSM 900 MHz transmission signal is input to a transmission signal input terminal Tx1, a GSM 1800 MHz transmission signal or a GSM 1900 MHz transmission signal is input to a transmission signal input terminal Tx2, a GSM 850 MHz reception signal is output from a reception signal output terminal Rx1, a GSM 900 MHz reception signal is output from a reception signal output terminal Rx2, a GSM 1800 MHz reception signal is output from a reception signal output terminal Rx3, and a GSM 1900 MHz reception signal is output from a reception signal output terminal Rx4. A FET switch SW50, which is a GaAs switch, includes an antenna input/output port ANT0 connecting to an antenna ANT and RF input/output ports RF61 to RF66 (hereinafter simply referred to as "RF61 port" to "RF66 port") to input/output any of GSM 850 MHz transmission/reception signals, GSM 900 MHz signals, GSM 1800 MHz transmission/reception signals, and GSM 1900 MHz signals. The FET switch SW50 also includes a driving voltage input port (not shown) to which a driving voltage is input and a control signal input port (not shown) to which a control signal to control switching is input. The control signal input to the control signal input port causes conduction between the antenna input/output port ANT0 and any of the RF61 to RF66 ports. The RF61 port corresponds to a "first transmission port" of the present invention and the RF62 port corresponds to a "second transmission port" of the present invention. The RF63 port corresponds to a "first reception port" of the present invention, the RF64 port corresponds to a "second reception port" of the present invention, the RF65 port corresponds to a "third reception port" of the present invention, and the RF66 port corresponds to a "fourth reception port" of the present invention.

The RF61 port of the FET switch SW50 is connected to a phase setting element GL1 defined by a transmission line. An end of the phase setting element GL1, which is opposite to the RF61 port, is connected to a low-pass filter LPF71. The electrical length of the phase setting element GL1 is set to substantially one fourth of the wavelength of a transmission signal to be transmitted, that is, a GSM 850 MHz transmission signal and a GSM 900 MHz transmission signal. In other words, assuming that the electrical length of the phase setting element L1 is "A" and that the wavelength of the transmission signal is "$\lambda_4$", $0<A<\lambda_4/4$ is satisfied. Herein, the wavelength $\lambda_4$ of the GSM 850 MHz transmission signal is slightly different from that of the GSM 900 MHz transmission signal.

For example, the wavelength of the GSM 850 MHz transmission signal having a longer wavelength is set as the "λ". The phase setting element GL1 is defined by a transmission line.

The low-pass filter LPF71 is connected to a low-pass filter LPF72. The low-pass filter LPF72 is connected to the transmission signal input terminal Tx1. A node between the low-pass filters LPF71 and LPF72 is connected to the ground (grounded) through a capacitor GCu2.

The low-pass filter LPF 71 includes an inductor GLt1 defined by a transmission line, one end thereof being connected to the phase setting element GL1 and the other end thereof being connected to the low-pass filter LPF72; a capacitor GCc1 connected in parallel to the inductor GLt1; and a capacitor GCu1 provided between the phase setting element GL1 side of the inductor GLt1 and the ground. Due to the inductor GLt1 and the capacitors GCc1 and GCu1, the low-pass filter LPF71 has an attenuation characteristic such that frequencies of second-order harmonics of the GSM 850 MHz transmission signal and the GSM 900 MHz transmission signal are in the stop band and frequencies of fundamentals thereof are in the pass band.

The low-pass filter LPF72 includes an inductor GLt2 defined by a transmission line, one end thereof being connected to the low-pass filter LPF71 and the other end thereof being connected to the transmission signal input terminal Tx1; and a capacitor GCc2 connected in parallel to the inductor GLt2. Due to the inductor GLt2 and the capacitor GCc2, the low-pass filter LPF72 has an attenuation characteristic such that frequencies of third-order harmonics of the GSM 850 MHz transmission signal and the GSM 900 MHz transmission signal are in the stop band and frequencies of fundamentals thereof are in the pass band. Optionally, the low-pass filter LPF72 may be provided with a capacitor GCu3 (shown in parentheses in FIG. 4), which is disposed between the transmission signal input terminal Tx1 side of the inductor GLt2 and the ground, for the purpose of impedance control.

The RF62 port of the FET switch SW50 is connected to a phase setting element DL1 defined by a transmission line. An end of the phase setting element DL1, which is opposite to the RF62 port, is connected to a low-pass filter LPF81. The electrical length of the phase setting element DL1 is set to substantially one fourth of the wavelength of a transmission signal to be transmitted, that is, a GSM 1800 MHz transmission signal and a GSM 1900 MHz transmission signal. In other words, assuming that the electrical length of the phase setting element L1 is "B" and that the wavelength of the transmission signal is "$\lambda_B$", $0<B<\lambda_B/4$ is satisfied. Herein, the wavelength $\lambda_B$ of the GSM 1800 MHz transmission signal is slightly different from that of the GSM 1900 MHz transmission signal. For example, the wavelength of the GSM 1800 MHz transmission signal having a longer wavelength is set as the "$\lambda_B$".

The low-pass filter LPF81 is connected to a low-pass filter LPF82. The low-pass filter LPF82 is connected to the transmission signal input terminal Tx2. A node between the low-pass filters LPF81 and LPF82 is connected to the ground (grounded) through a capacitor DCu2.

The low-pass filter LPF 81 includes an inductor DLt1 defined by a transmission line, one end thereof being connected to the phase setting element DL1 and the other end thereof being connected to the low-pass filter LPF82; a capacitor DCc1 connected in parallel to the inductor DLt1 and a capacitor DCu1 provided between the phase setting element DL1 side of the inductor DLt1 and the ground. Due to the inductor DLt1 and the capacitors DCc1 and DCu1, the low-pass filter LPF81 has an attenuation characteristic such that frequencies of second-order harmonics of the GSM 1800 MHz transmission signal and the GSM 1900 MHz transmission signal are in the stop band and frequencies of fundamentals thereof are in the pass band.

The low-pass filter LPF82 includes an inductor DLt2 defined by a transmission line, one end thereof being connected to the low-pass filter LPF81 and the other end thereof being connected to the transmission signal input terminal Tx2; a capacitor DCc2 connected in parallel to the inductor DLt2; and a capacitor DCu3 provided between the transmission signal input terminal Tx2 side of the inductor DLt2 and the ground. Due to the inductor DLt2 and the capacitors DCc2 and DCu2, the low-pass filter LPF82 has an attenuation characteristic such that frequencies of third-order harmonics of the GSM 1800 MHz transmission signal and the GSM 1900 MHz transmission signal are in the stop band and frequencies of fundamentals thereof are in the pass band.

The RF63 port of the FET switch SW50 is connected to a band-pass filter BPF91 whose pass band includes a frequency of the GSM 850 MHz reception signal. The band-pass filter BPF91 is connected to the reception signal output terminal Rx1. The RF64 port of the FET switch SW50 is connected to a band-pass filter BPF92 whose pass band includes a frequency of the GSM 900 MHz reception signal. The band-pass filter BPF92 is connected to the reception signal output terminal Rx2. The RF65 port of the FET switch SW50 is connected to a band-pass filter BPF93 whose pass band includes a frequency of the GSM 1800 MHz reception signal. The band-pass filter BPF93 is connected to the reception signal output terminal Rx3. The RF66 port of the FET switch SW50 is connected to a band-pass filter BPF94 whose pass band includes a frequency of the GSM 1900 MHz reception signal. The band-pass filter BPF94 is connected to the reception signal output terminal Rx4.

Hereinafter, an operation of transmitting the GSM 850 MHz transmission signal and the GSM 900 MHz transmission signal (hereinafter collectively referred to as first-group GSM transmission signals) performed by the high-frequency switch module according to this preferred embodiment is described. These two transmission signals are not simultaneously input, but only one of the transmission signals is input. Herein, the GSM 850 MHz signal corresponds to a "first communication signal" of the present invention and the GSM 900 MHz signal corresponds to a "second communication signal" of the present invention.

After a control signal to cause conduction between the RF61 port and the antenna input/output port ANT0 has been input to the control signal input port of the FET switch SW50, the FET switch SW50 allows the RF61 port and the antenna input/output port ANT0 to come into conduction. In this state, if a first-group GSM transmission signal is input to the transmission signal input terminal Tx1, a third-order harmonic input together with a fundamental of the first-group GSM transmission signal is attenuated in the low-pass filter LPF72, a second-order harmonic input together with the fundamental of the first-group GSM transmission signal is attenuated in the low-pass filter LPF71, and then the first-group GSM transmission signal is input to the RF61 port through the phase setting element GL1.

After the first-group GSM transmission signal has been input to the FET switch SW50, harmonic distortion occurs due to a nonlinear characteristic of the GaAs switch, so that harmonics of a predetermined amount "Y" are evenly output to the respective ports (RF61 to RF66 ports and antenna input/output port ANT0).

The harmonics output from the RF61 port are transmitted to the phase setting element GL1.

Herein, the phase setting element GL1 has a predetermined electrical length on the basis of the following condition. That is, the electrical length is set to such a length that the harmonics of the first-group GSM transmission signal output from the RF61 port are transmitted through the phase setting element GL1 so that the phase thereof changes and that the impedance of the low-pass filters LPF71 and LPF72 side viewed from the RF61 port with respect to the harmonics changes by a predetermined amount from the infinite toward 0 (zero). Accordingly, the low-pass filters LPF71 and LPF72 side changes from an open state toward a short-circuited state, when viewed from the RF61 port. At this time, the electrical length of the phase setting element GL1 is set such that the impedance to a second-order harmonic of the first-group GSM transmission signal is changed by a predetermined amount only by the phase setting element GL1, and such that the impedance to a third-order harmonic of the first-group GSM transmission signal is changed by a predetermined amount by the phase setting element GL1 and values (inductance and capacitance) of the respective elements defining the low-pass filter LPF71.

Accordingly, all of the harmonics output from the RF61 port do not return to the RF61 port by complete reflection, but a portion thereof is transmitted to the low-pass filters LPF71 and LPF72 side. The harmonics (including second-order and third-order harmonics) transmitted to the low-pass filters LPF71 and LPF72 are transmitted to the ground and do not return to the RF61 port side. That is, assuming that the amount of harmonics returning to the RF61 port is "γ" and that the amount of returned harmonics in the known high-frequency switch module is "α", γ<α is satisfied.

On the other hand, harmonics output from the RF62 to RF66 ports are transmitted to a circuit including the low-pass filters LPF82 and LPF81 and the band-pass filters BPF91 to BPF94 and are attenuated, and thus, do not substantially return to the RF62 to RF66 ports.

Accordingly, the amount of reflected harmonics returning to the FET switch SW50 is less than that in the known high-frequency switch module (FIG. 7), which is not provided with the phase setting element GL1. As a result, the amount of harmonics output to the antenna input/output port ANT0 is "Y+γ", which is less than the amount of harmonics "Y+α" in the known high-frequency switch module (FIG. 7).

As described above, by using the configuration according to this preferred embodiment, harmonics output to the antenna are greatly reduced and a transmission characteristic is improved. Furthermore, the phase setting element GL1 is set such that the impedance changes with respect to only a target harmonic. Thus, with respect to a fundamental of a first group GSM transmission signal, the phase is changed but the impedance is not substantially changed.

Hereinafter, an operation of transmitting the GSM 1800 MHz transmission signal and the GSM 1900 MHz transmission signal (hereinafter collectively referred to as second-group GSM transmission signals) performed by the high-frequency switch module according to this preferred embodiment is described. These two transmission signals are not simultaneously input, but only one of the transmission signals is input. Also, the transmission signal is not simultaneously input with the above-described GSM 850 MHz transmission signal and the GSM 900 MHz transmission signal. Herein, the GSM 1800 MHz signal corresponds to a "third communication signal" of the present invention and the GSM 1900 MHz signal corresponds to a "fourth communication signal" of the present invention.

After a control signal to cause conduction between the RF62 port and the antenna input/output port ANT0 has been input to the control signal input terminal of the FET switch SW50, the FET switch SW50 allows the RF62 port and the antenna input/output port ANT0 to come into conduction. In this state, if a second-group GSM transmission signal is input to the transmission signal input terminal Tx2, a third-order harmonic input together with a fundamental of the second-group GSM transmission signal is attenuated in the low-pass filter LPF82, a second-order harmonic input together with the fundamental of the second-group GSM transmission signal is attenuated in the low-pass filter LPF81, and then the second-group GSM transmission signal is input to the RF62 port through the phase setting element DL1.

After the second-group GSM transmission signal has been input to the FET switch SW50, harmonic distortion occurs due to a nonlinear characteristic of the GaAs switch, such that harmonics of a predetermined amount "Z" are evenly output to the respective ports (RF61 to RF66 ports and antenna input/output port ANT0).

The harmonics output from the RF61 port are transmitted to the phase setting element DL1.

Herein, the phase setting element DL1 has a predetermined electrical length on the basis of the following condition. That is, the electrical length is set such that the harmonics of the second-group GSM transmission signal output from the RF62 port are transmitted through the phase setting element DL1 so that the phase thereof changes and the impedance of the low-pass filters LPF81 and LPF82 side viewed from the RF62 port with respect to the harmonics shifts by a predetermined amount from infinity towards 0 (zero). Accordingly, the low-pass filters LPF81 and LPF82 side changes from an open state towards a short-circuited state, when viewed from the RF62 port. At this time, the electrical length of the phase setting element DL1 is set such that the impedance to a second-order harmonic of the second-group GSM transmission signal is shifted by a predetermined amount only by the phase setting element DL1 and such that the impedance to a third-order harmonic of the second-group GSM transmission signal is shifted by a predetermined amount by the phase setting element DL1 and values (inductance and capacitance) of the respective elements defining the low-pass filter LPF81.

Accordingly, all of the harmonics output from the RF62 port do not return to the RF62 port by total reflection, but a portion thereof is transmitted to the low-pass filters LPF81 and LPF82 side. The harmonics (including second-order and third-order harmonics) transmitted to the low-pass filters LPF81 and LPF82 are transmitted to the ground and do not return to the RF62 port side. That is, assuming that the amount of harmonics returning to the RF62 port is "δ" and that the amount of returned harmonics in the known high-frequency switch module is "α", δ<α is satisfied.

On the other hand, harmonics output from the RF61 port are transmitted to a circuit including the low-pass filters LPF72 and LPF71 and are attenuated, and harmonics output from the RF63 to RF66 ports are transmitted to band-pass filters BPF91 to LPF94 and are attenuated. Thus, the harmonics do not substantially return to the RF61 port or to the RF63 to RF66 ports.

Acordingly, the amount of reflected harmonics returning to the FET switch SW50 is less than that in the known high-frequency switch module (FIG. 7), which is not provided with the phase setting element DL1. As a result, the amount of harmonics output to the antenna input/output port ANT0 is "Z+δ", which is less than the amount of harmonics "Z+α" in the known high-frequency switch module (FIG. 7).

As described above, by using the configuration according to this preferred embodiment, harmonics output to the antenna are greatly reduced and a transmission characteristic is improved. Furthermore, the phase setting element DL1 is set such that the impedance changes with respect to only a harmonic. Thus, with respect to a fundamental of a second group GSM transmission signal, the phase is changed but the impedance is not substantially changed.

Table 1 shows the ratio of a double harmonic and a triple harmonic of each GSM transmission signal to input power in each high-frequency switch module according to this preferred embodiment and the known high-frequency switch module. The ratio is represented by decibel and the element of each value is [dBc]. In Table 1, "Present invention a" corresponds to FIG. 2A, "Present invention c" corresponds to FIG. 3A, and "Present invention d" corresponds to FIG. 3B.

TABLE 1

| | Input power Pin | | | | | | | |
|---|---|---|---|---|---|---|---|---|
| | 35 dBm | | | | 33 dBm | | | |
| | Type of communication signal | | | | | | | |
| | GSM850 | | GSM900 | | GSM1800 | | GSM1900 | |
| | Harmonic frequency | | | | | | | |
| | 2fo | 3fo | 2fo | 3fo | 2fo | 3fo | 2fo | 3fo |
| Known art (without phase circuit) | 78.85 | 76.51 | 78.46 | 79.79 | 83.57 | 67.05 | 85.97 | 67.15 |
| Present invention a (with phase circuit) | 79.16 | 78.94 | 80.87 | 80.74 | 85.92 | 71.42 | 87.78 | 71.48 |
| Present invention c (with phase circuit) | 78.91 | 77.65 | 79.01 | 81.06 | 84.01 | 70.62 | 86.15 | 72.13 |
| Present invention d (with phase circuit) | 79.11 | 79.05 | 80.68 | 80.12 | 85.88 | 72.62 | 87.62 | 70.53 |

As shown in Table 1, the ratio of a harmonic to input power in each GSM transmission signal is reduced (larger decibel value) by using the configuration of this preferred embodiment (using the phase setting element). In other words, harmonics in an output transmission signal are reduced. Particularly, in the GSM 1800 MHz transmission signal and the GSM 1900 MHz transmission signal, the ratio of a triple harmonic is less than a standard value 70 dBc (GSM 1800 MHz transmission signal: 67.05 dBc, and GSM 1900 MHz transmission signal: 67.15 dBc) when the known configuration is used, whereas the ratio satisfies the standard value (GSM 1800 MHz transmission signal: 71.42 dBc, and GSM 1900 MHz transmission signal: 71.48 dBc) when the configuration of the "Present invention a" of one of the preferred embodiments is used. Also, the ratio satisfies the standard value (GSM 1800 MHz transmission signal: 70.62 dBc, and GSM 1900 MHz transmission signal: 72.13 dBc) when the configuration of the "Present invention c" of one of the preferred embodiments is used. Also, the ratio satisfies the standard value (GSM 1800 MHz transmission signal: 72.62 dBc, and GSM 1900 MHz transmission signal: 70.53 dBc) when the configuration of the "Present invention d" of one of the preferred embodiments is used. In this way, higher-order harmonics are attenuated by disposing the Smith chart position of the impedance to a second-order or third-order harmonic of a transmission signal viewed from the transmission input port toward the filter near the zero impedance, by using the phase setting element.

As described above, by using the configuration of this preferred embodiment, harmonics of the four GSM transmission signals using different frequency bands are suppressed, but the fundamentals of the signals are transmitted with substantially no attenuated. That is, a high-frequency switch module which suppresses only harmonics of respective GSM transmission signals and transmitting the signals while causing little loss of the fundamentals thereof is provided.

The harmonics are suppressed using only a transmission line in which the phase control amount is set. Accordingly, an increase in size of the high-frequency switch module is prevented and a simple configuration is achieved.

Hereinafter, a configuration of a laminated body of the high-frequency switch module shown in FIG. 4 is described with reference to FIGS. 5 and 6.

Figure 5:
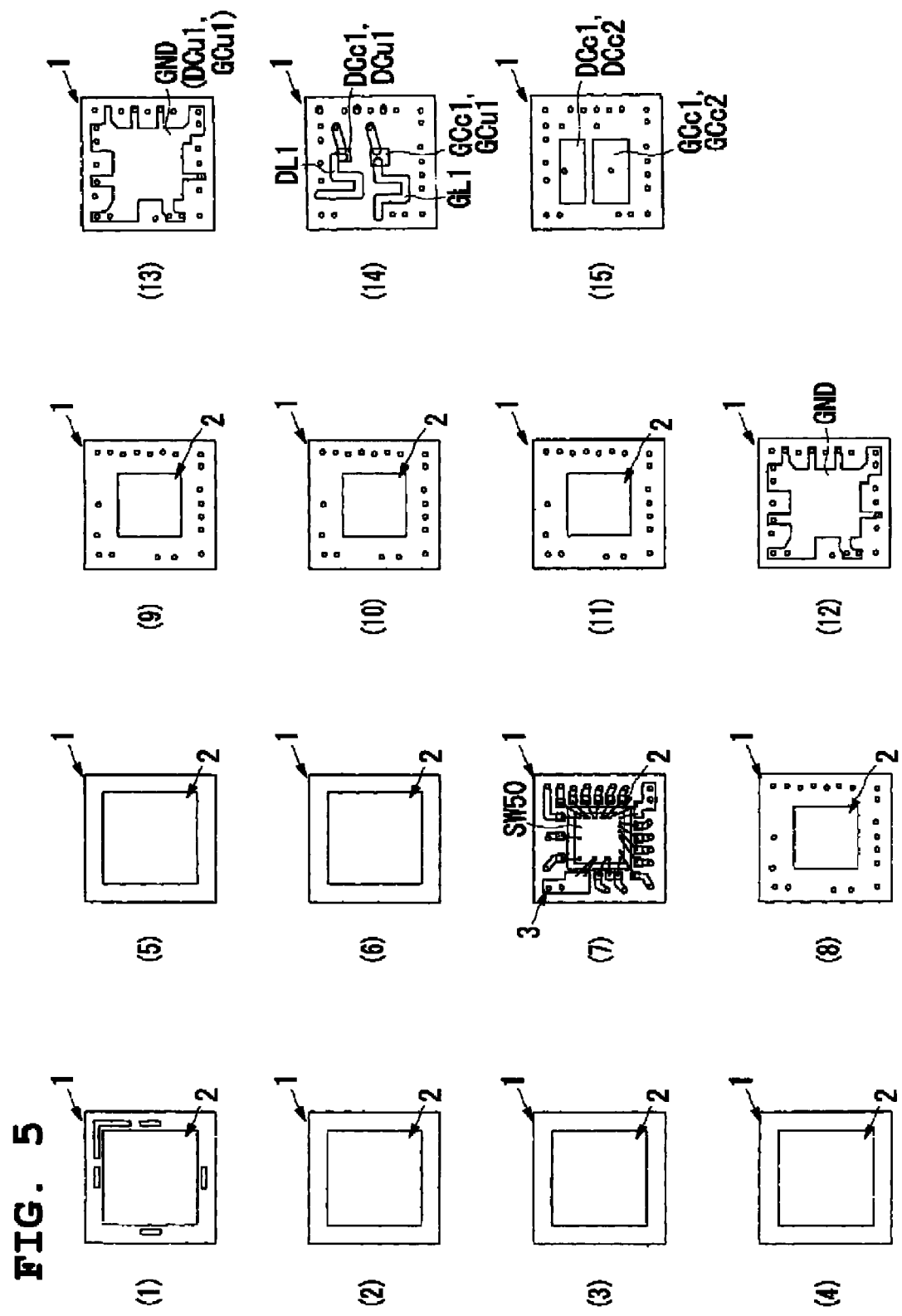
FIG. 5 is a lamination diagram of the high-frequency switch module shown in FIG. 4.
Figure 6:
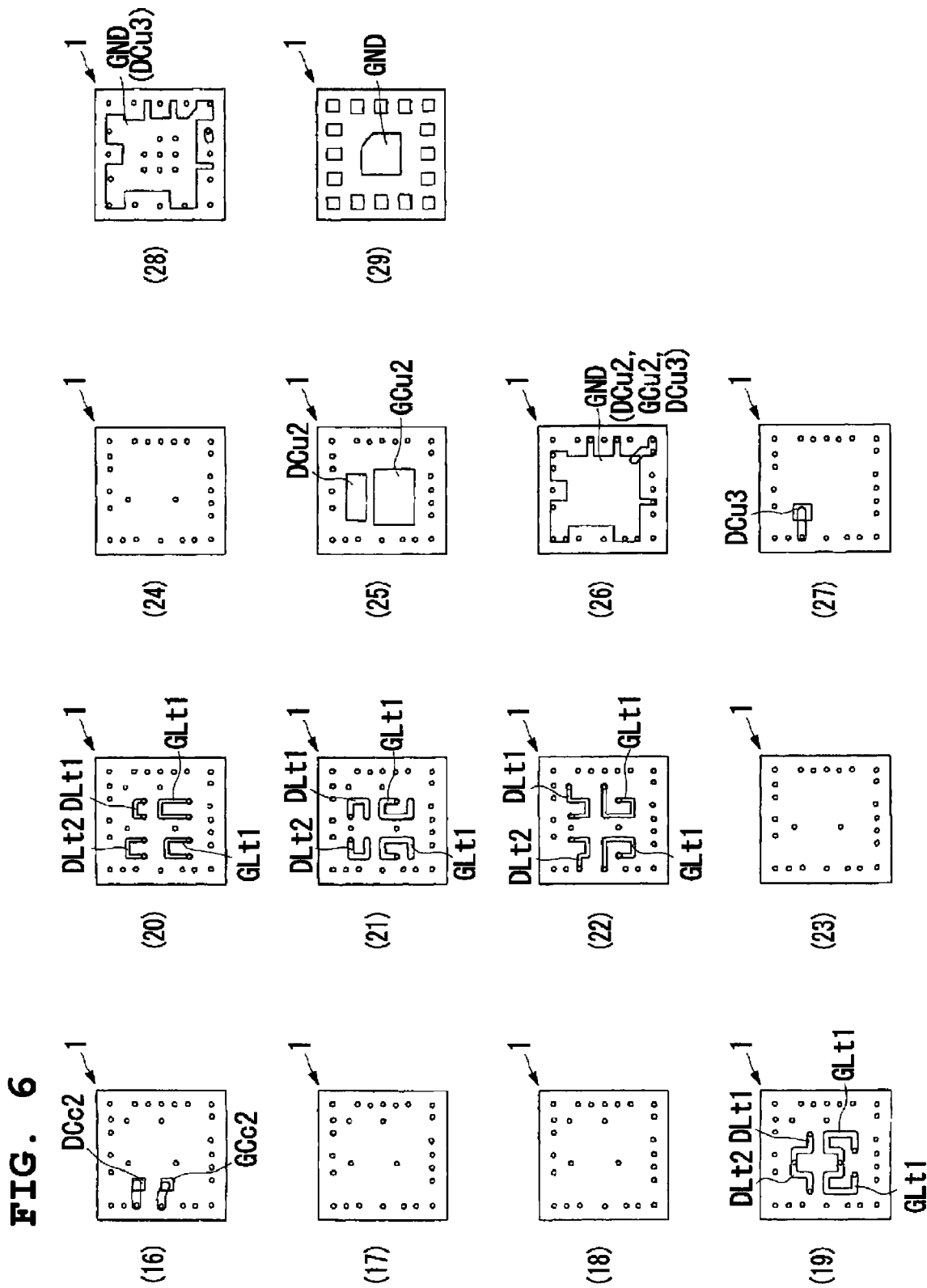
FIG. 6 is a lamination diagram of the high-frequency switch module shown in FIG. 4.

FIGS. 5 and 6 are lamination diagrams of the high-frequency switch module according to this preferred embodiment. FIGS. 5 and 6 show respective dielectric layers (1) to (28) of the laminated high-frequency switch module according to this preferred embodiment viewed from the top, and a dielectric layer (29) is a rear surface of the dielectric layer (28), that is, the bottom surface of the high-frequency switch module. The reference numerals shown in FIGS. 5 and 6 correspond to those attached to the respective elements shown in FIG. 4. In FIGS. 5 and 6, reference numeral 1 denotes a laminated body, reference numeral 2 denotes a cavity, and reference numeral 3 denotes a through hole. Reference numeral 3 is attached to a representative through hole, but all circles having the same diameter shown in the figures are through holes.

The laminated body 1 is made by laminating the dielectric layers (1) to (18) in numeric order, the dielectric layer (1) being the top layer. The top dielectric layers (1) to (11) have a square hole at their approximate center, each side of the square having a predetermined length. These dielectric layers (1) to (11) are laminated such that the holes define the cavity 2. The FET switch SW50 is disposed in the cavity 2. The top surface of the FET switch SW50 and wires connected to the top surface for wire bonding do not protrude from the top surface of the laminated body 1, that is, the FET switch SW50 is accommodated in the laminated body 1. External connecting electrodes including a ground electrode GND are provided on the rear surface of the bottom dielectric layer (28) (on the dielectric layer (29) shown in FIG. 6). These electrodes enable the high-frequency switch module to be mounted on an external circuit board.

The top dielectric layer (1) to the dielectric layer (6) are provided with only a hole, but no electrode pattern is formed thereon.

The dielectric layer (7) is provided with pad electrodes to be wire-bonded to the respective terminal electrodes of the FET switch SW50. These pad electrodes are connected to the terminal electrodes of the FET switch SW50 by wire bonding.

The dielectric layers (8) to (11) are provided with only through holes 3.

The dielectric layers (12) and (13) are provided with a ground electrode GND. These ground electrodes GND also define opposed electrodes of the capacitors DCu1 and Gcu1.

The dielectric layer (14) is provided with opposed electrodes of the capacitors DCc1 and Gcc1 and transmission lines defining the inductors DL1 and GL1. The opposed electrodes of the capacitors DCc1 and Gcc1 also define the opposed electrodes of the capacitors DCu1 and Gcu1.

The dielectric layer (15) is provided with opposed electrodes of the capacitors DCc1 and GCc1. The opposed electrode of the capacitor DCc1 also defines the opposed electrode of the capacitor DCc2. The opposed electrode of the capacitor GCc1 also defines the opposed electrode of the capacitor GCc2.

The dielectric layer (16) is provided with opposed electrodes of the capacitors DCc2 and GCc2.

The dielectric layers (17) and (18) are provided with only through holes 3.

The dielectric layers (19) to (22) are provided with the inductors DLt1, DLt2, GLt1, and GLt2 over the four layers.

The dielectric layers (23) and (24) are provided with only through holes 3.

The dielectric layer (25) is provided with opposed electrodes of the capacitors DCu2 and GCu2.

The dielectric layer (26) is provided with a ground electrode GND, which also defines an opposed electrode of the capacitors DCu2, GCu2, and DCu3.

The dielectric layer (27) is provided with an opposed electrode of the capacitor DCu3.

A ground electrode GND is provided on the top surface of the dielectric layer (28). The ground electrode GND also defines an opposed electrode of the capacitor DCu3. The rear surface of the dielectric layer (28) (the dielectric layer (29) in FIG. 6) is provided with a ground electrode GND and various external connecting electrodes.

These electrode patterns are in conduction with each other over the layers due to the through holes 3, so that the circuit shown in FIG. 4 is provided.

With this configuration, the high-frequency switch module is obtained by a single laminated body. Accordingly, the high-frequency switch module can be miniaturized.

In the above description, the FET switch SW50 is accommodated in the laminated body. Alternatively, the FET switch SW50 may be mounted on the surface of the laminated body. Instead of using wire bonding to connect the FET switch to the laminated body, bump connection may be used by using a flip-chip FET switch. Furthermore, although the respective circuit elements defining the high-frequency switch module are formed by the electrodes provided on the surfaces of the respective dielectric layers, mounted inductors and capacitors may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A high-frequency switch module comprising:
   a FET switch including a transmission input port arranged to receive a transmission signal, a reception output port arranged to output a reception signal, and an antenna port arranged to output the transmission signal to an antenna or to receive the reception signal from the antenna, the FET switch being arranged to connect the antenna port to the transmission input port or the reception output port by switching between the transmission input port and the reception output port; and
   a filter connected to the transmission input port and arranged to attenuate a higher-order harmonic of the transmission signal; wherein
   the filter includes a first low-pass filter and a second low-pass filter connected in series, the first low-pass filter including a transmission line and a stop band that includes a frequency of a second-order harmonic of the transmission signal, the second low-pass filter including a stop band that includes a frequency of a third-order harmonic of the transmission signal;
   a phase setting element including a transmission line is provided between the transmission input port of the FET switch and the filter; and
   an electrical length of the transmission line of the phase setting element is less than one fourth of a wavelength of the second-order harmonic and is set such that an impedance of a filter side viewed from the FET switch with respect to both the second-order harmonic and the third-order harmonic of the transmission signal is set to a predetermined impedance by shifting the impedance clockwise from infinity on a Smith chart to cause a phase change, such that an absolute value of an impedance with respect to a fundamental of the transmission signal does not change as compared to a state in which the phase setting element is not provided, and the impedance of the filter side viewed from the FET switch with respect to one of the first and second low-pass filters that is disposed on a side farthest from the FET switch is adjusted to be the predetermined impedance.

2. The high-frequency switch module according to claim 1, wherein the FET switch includes reception output ports arranged to process a plurality of communication signals including transmission and reception signals using specific frequency bands which are input/output thereto.

3. The high-frequency switch module according to claim 1, wherein the transmission input port includes a plurality of transmission input ports and the phase setting element includes a plurality of phase setting elements connected to the plurality of transmission input ports.

4. The high-frequency switch module according to claim 1, wherein
   the FET switch includes a first transmission input port arranged to receive a transmission signal of a first communication signal using a first frequency band and a transmission signal of a second communication signal using a second frequency band, a second transmission input port arranged to receive a transmission signal of a third communication signal using a third frequency band and a transmission signal of a fourth communication signal using a fourth frequency band, a first reception output port arranged to output a reception signal of the first communication signal, a second reception output port arranged to output a reception signal of the second communication signal, a third reception output port arranged to output a reception signal of the third communication signal, and a fourth reception output port arranged to output a reception signal of the fourth communication signal; and
   the phase setting element includes:
      a first phase setting element including a transmission line having an electrical length that is set so that the impedance of the filter side viewed from the FET switch with respect to both second-order harmonics and third-order harmonics of the transmission signals of the first communication signal and the second communication signal is set to a predetermined impedance by shifting the impedance clockwise from infinity on the Smith chart to cause a phase change, and such that an absolute value of an impedance with respect to fundamentals of the transmission signals of the first communication signal and the second communication signal does not change as compared to a state in which the phase setting element is not provided; and
      a second phase setting element including a transmission line having an electrical length that is set so that an impedance of a filter side viewed from the FET switch with respect to both second-order harmonics and third-order harmonics of the transmission signals of the third communication signal and the fourth communication signal is set to a predetermined impedance by shifting the impedance clockwise from infinity on the Smith chart to cause a phase change, and such that an absolute value of an impedance with respect to fundamentals of the transmission signals of the third communication signal and the fourth communication signal does not change as compared to a state in which the phase setting element is not provided.

5. The high-frequency switch module according to claim 1, wherein the FET switch, the filter, and the phase setting element are integrally included in a laminated body including a plurality of laminated dielectric layers.

6. The high-frequency switch module according to claim 5, wherein the filter and the phase setting element are defined by an electrode pattern provided in the laminated body and are arranged in order of the filter and the phase setting element from a side of a ground electrode in a lowest layer of the laminated body.

\* \* \* \* \*